(12) United States Patent
Boe et al.

(10) Patent No.: US 9,590,419 B2
(45) Date of Patent: Mar. 7, 2017

(54) POWER SWITCHING ASSEMBLY

(75) Inventors: Ove Boe, Tanem (NO); Alf Olav Valen, Jakobsli (NO)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 292 days.

(21) Appl. No.: 13/825,953

(22) PCT Filed: Feb. 7, 2011

(86) PCT No.: PCT/EP2011/051727
§ 371 (c)(1),
(2), (4) Date: Mar. 25, 2013

(87) PCT Pub. No.: WO2012/038101
PCT Pub. Date: Mar. 29, 2012

(65) Prior Publication Data
US 2013/0187451 A1   Jul. 25, 2013

(30) Foreign Application Priority Data
Sep. 24, 2010   (EP) ..................... 10179518

(51) Int. Cl.
*H02J 1/14* (2006.01)
*H02J 1/00* (2006.01)
(Continued)

(52) U.S. Cl.
CPC  *H02J 1/00* (2013.01); *H02J 1/14* (2013.01);
*H02J 3/14* (2013.01); *H02J 3/28* (2013.01);
(Continued)

(58) Field of Classification Search
CPC ......... H03K 17/66; H03K 17/18; H02M 7/00; H02J 1/14; H02J 3/14; H02J 3/28
(Continued)

(56) References Cited

U.S. PATENT DOCUMENTS 3,585,358 A * 6/1971 Nilssen ................... 219/202
4,835,652 A   5/1989 Billings et al. ............ 361/79
(Continued)

FOREIGN PATENT DOCUMENTS

CN       1039665 A   2/1990   ......... G01R 19/155
CN     101821946 A   9/2010   ......... H03K 17/693
(Continued)

OTHER PUBLICATIONS

Chinese Office Action, Application No. 201180045744.X, 11 pages, Jan. 12, 2015.
(Continued)

*Primary Examiner* — Rexford Barnie
*Assistant Examiner* — Terrence Willoughby
(74) *Attorney, Agent, or Firm* — Slayden Grubert Beard PLLC

(57) ABSTRACT

A power switching assembly for switching power in a power distribution bus, and a power distribution system including such a power switching assembly, are disclosed. The power switching assembly includes a first terminal, a second terminal, a first semiconductor element and a second semiconductor element electrically coupled between the first terminal and the second terminal to provide controllability of a current flow from the first terminal to the second terminal and from the second terminal to the first terminal A controller for controlling the semiconductor elements may be configured to implement one or more of various control schemes such as a breaker, a current limiter, a load balancer, and a precharging device.

14 Claims, 2 Drawing Sheets

(51) Int. Cl.
*H02J 3/14* (2006.01)
*H02J 3/28* (2006.01)
*H03K 17/18* (2006.01)
*H03K 17/66* (2006.01)
*H03K 17/56* (2006.01)
*H02M 7/00* (2006.01)

(52) U.S. Cl.
CPC ............ *H03K 17/18* (2013.01); *H03K 17/56* (2013.01); *H03K 17/66* (2013.01); *H02M 7/003* (2013.01); *Y10T 307/25* (2015.04); *Y10T 307/352* (2015.04)

(58) Field of Classification Search
USPC ............ 307/11, 24; 327/419; 361/93.1, 93.9
See application file for complete search history.

(56) References Cited

U.S. PATENT DOCUMENTS

| | | | | |
|---|---|---|---|---|
| 5,754,033 A | * | 5/1998 | Thomson | H02J 3/38 307/57 |
| 5,789,902 A | | 8/1998 | Abe et al. | 320/134 |
| 7,405,542 B1 | * | 7/2008 | McAvoy | H02P 5/747 322/14 |
| 8,072,093 B2 | * | 12/2011 | Jacobson | H02H 7/22 307/19 |
| 8,723,373 B2 | | 5/2014 | Kästli | 307/151 |
| 2006/0066385 A1 | | 3/2006 | Dodd et al. | 327/432 |

FOREIGN PATENT DOCUMENTS

| | | | | |
|---|---|---|---|---|
| EP | 0574815 A1 | 12/1993 | ............... | H02P 7/00 |
| GB | 2375664 A | 11/2002 | ............... | H02J 3/14 |
| WO | 2012/038101 A1 | 3/2012 | ............. | H03K 17/66 |

OTHER PUBLICATIONS

International Search Report and International Preliminary Opinion on Patentability, Application No. PCT/EP2011/051727, 9 pages, May 30, 2011.

Chinese Office Action, Application No. 201180045744.X, 13 pages, Jun. 8, 2015.

* cited by examiner

POWER SWITCHING ASSEMBLY

CROSS-REFERENCE TO RELATED APPLICATIONS

This application is a U.S. National Stage Application of International Application No. PCT/EP2011/051727 filed Feb. 7, 2011, which designates the United States of America, and claims priority to EP Patent Application No. 10179518.5 filed Sep. 24, 2010 The contents of which are hereby incorporated by reference in their entirety.

TECHNICAL FIELD

The present disclosure relates to the field of power distribution systems.

BACKGROUND

As is known from practice, a power distribution bus of a power distribution system may be splitted into several bus sections for reliability purposes. The bus sections may be connected with a removable bus link.

In view of the above-described situation, there exists a need for an improved technique that enables to provide a power distribution bus with improved characteristics.

SUMMARY

One embodiment provides a power switching assembly for switching power in a power distribution bus, the power switching assembly comprising: a first terminal; a second terminal; and a first semiconductor element and a second semiconductor element electrically coupled between the first terminal and the second terminal so as to provide controllability of a current flow from the first terminal to the second terminal and from the second terminal to the first terminal.

In a further embodiment, the power switching assembly further comprises a current sensor for sensing a current flowing between the first terminal and the second terminal and providing a current signal in response hereto; and a controller being configured for receiving the current signal and controlling in response hereto the first semiconductor element and the second semiconductor element.

In a further embodiment, the controller is configured for controlling the first semiconductor element and the second semiconductor element in response to the current signal so as to control the magnitude of the current flowing between the first terminal and the second terminal in response to the current signal.

In a further embodiment, the power switching assembly further comprises a control input for receiving an external control signal; and the controller is configured for controlling, in response to the external control signal, the first semiconductor element and the second semiconductor element.

Another embodiment provides a power distribution system comprising: a power distribution bus having a first bus section and a second bus section, wherein to each bus section at least one electrical consumer is electrically coupleable; and a power switching assembly as disclosed above, the power switching assembly having its first terminal electrically coupled to the first bus section and having its second terminal electrically coupled to the second bus section.

In a further embodiment, the power distribution system comprises: a first generator for providing electrical energy to the first bus section; a second generator for providing electrical energy to the second bus section; and a load controller, the load controller being configured for providing the external control signal to the control input of the power switching assembly in order to control to the magnitude of the current flowing between the first terminal and the second terminal so as alter a load distribution among the first generator and the second generator.

In a further embodiment, the power distribution bus is a DC power distribution bus.

Another embodiment provides a method of operating a power distribution system having a power distribution bus with a first bus section and a second bus section, the method comprising controlling a current flow from the first bus section to the second bus section and from the second bus section to the first bus section.

Another embodiment provides a computer program for controlling a physical object, e.g., a power switching assembly in a power distribution bus, the computer program being stored in non-transitory computer readable media and configured for carrying out the method disclosed above when executed by a processor.

Another embodiment provides a use of a power switching assembly as a coupler of two bus sections of a power distribution bus.

BRIEF DESCRIPTION OF THE DRAWINGS

Exemplary embodiments will be explained in more detail below on the basis of the schematic drawings, wherein.

DETAILED DESCRIPTION

Figure 1:
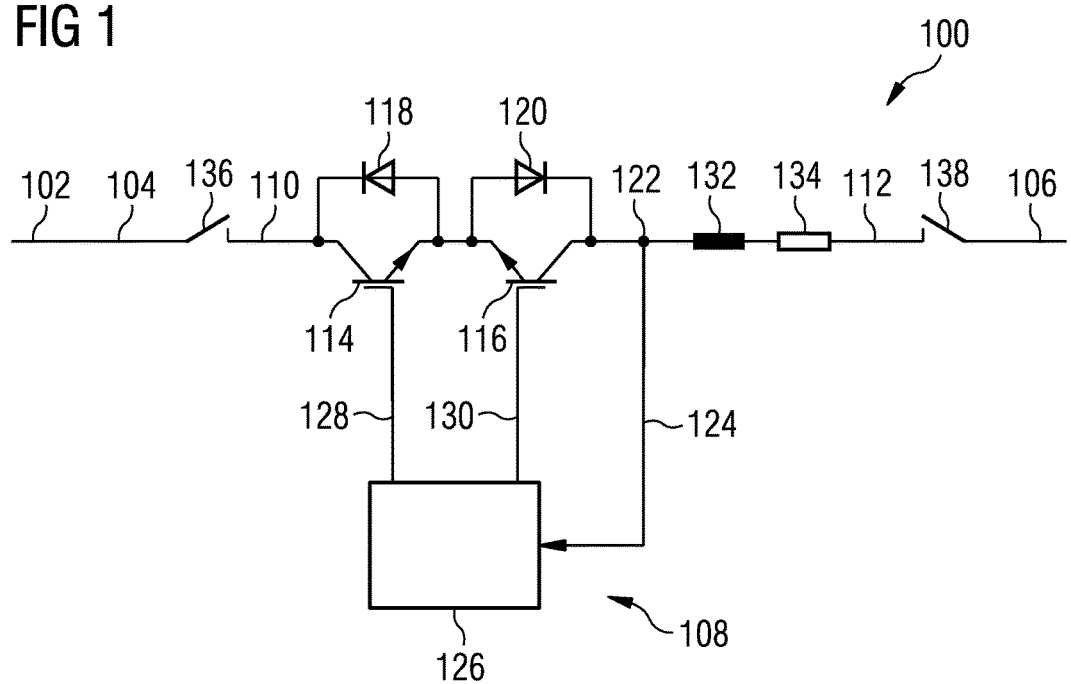
FIG. 1 shows in part an electrical power distribution system in accordance with embodiments of the herein disclosed subject matter.

Some embodiments provide a power switching assembly for switching power in a power distribution bus, the power switching assembly comprising a first terminal; a second terminal; and a first semiconductor element and a second semiconductor element electrically coupled between the first terminal and the second terminal so as to provide controllability of a current flow from the first terminal to the second terminal and from the second terminal to the first terminal.

By providing controllability of the current flow between the first terminal and the second terminal the characteristics of the power distribution bar can be increased. Certain embodiments provide one or more advantages as noted below.

It should be understood that according to embodiments of the herein disclosed subject matter, more than two semiconductor elements may be provided. In an embodiment, at least two of the semiconductor elements are transistors or thyristors. For example, in an embodiment, the power switching assembly includes two semiconductor elements in the form of an insulated gate bipolar transistor (IGBT). According to other embodiments, other kinds of transistors are used. According to an embodiment, the transistors are coupled in parallel. According to another embodiment, the transistors are coupled in series. In particular in the latter case further semiconductor elements, e.g. passive semiconductor elements such as diodes are provided in order to provide the controllability of the current flow between the terminals in both directions.

According to an embodiment, the power switching assembly further comprises a current sensor for sensing a current flowing between the first terminal and the second terminal and providing a current signal in response hereto; and a controller being configured for receiving the current signal and controlling in response hereto the first semiconductor element and the second semiconductor element.

The power switching assembly being controlled by the current flowing through the power switching assembly provides several advantages. In an embodiment the controller is configured for controlling the first semiconductor element and the second semiconductor element in response to the current signal so as to electrically disconnect the first terminal and the second terminal under predetermined current signal conditions. For example, according to an embodiment, the controller is configured for controlling the semiconductor elements so as to disconnect the first terminal and the second terminal if the magnitude of the current exceeds a current magnitude threshold. In such an embodiment, the power switching assembly forms a breaker. Further, while in an embodiment the controller defines a current magnitude threshold, in other embodiments the controller defines a current duration threshold. In an embodiment, the current duration threshold depends on the actual current magnitude. For example, in an embodiment the controller is configured for disconnecting the first terminal and the second terminal if the current magnitude is within a current magnitude interval for a time that exceeds a first duration threshold. According to further embodiments two or more of such current magnitude intervals and associated duration thresholds are defined in the controller.

While above the power switching assembly provides two states, connected first and second terminal and disconnected first and second terminals, without intermediate state, in other embodiments the power switching assembly provides intermediate states between the "connected" and "disconnected" extremes.

For example, according to a further embodiment, the controller is configured for controlling the first semiconductor element and the second semiconductor element in response to the current signal so as to control the magnitude of the current flowing between the first terminal and the second terminal in response to the current signal. Hence in this embodiment the power switching assembly provides at least one intermediate state in which the current flow between the first terminal and the second terminal is controllably altered by the control assembly.

In an embodiment, the power switching assembly is operable as a current limiter. For example, in an embodiment the controller is configured for controlling the first semiconductor element and the second semiconductor element in response to the current signal so as to limit the current flowing between the first terminal and the second terminal with regard to a predetermined current limit.

An application of current limitation by the power switching assembly may be the handling of a faulty bus section of the power distribution bus. For example, in an embodiment the controller is configured limiting the current flowing into a bus section. Such a case may arise if a consumer connected to the respective bus section and hence the terminal connected thereto draws too much current due to a fault. If the current drawn by the respective bus section is within a predetermined interval for a predetermined time, indicating such a fault, the controller is configured for disconnecting the respective bus section, in an embodiment.

Another application of current limitation is the control operation of the power switching assembly during energizing a bus section to which a plurality of devices with high input capacitances (such as inverters) are connected. The input capacitances lead to a high inrush current during energizing the bus section and having set therein a current limit, the power switching assembly acts as a current limiter. For example, in an embodiment, the control assembly is configured for operating the semiconductor devices so as to chop the power provided to the respective terminal, thereby operating the power switching assembly as a chopper.

According to a further embodiment, the power switching assembly further comprises a control input for receiving an external control signal; wherein the controller is configured for controlling, in response to the external control signal, the first semiconductor element and the second semiconductor element. The external control signal may be provided by a further control assembly (e.g. a higher level control assembly). For example, in an embodiment, the external signal is a load balancing signal provided by a control assembly (e.g. a load controller) that balances the load of generators electrically coupled to the power switching assembly.

Other embodiments provide a power distribution system comprising: A power distribution bus having a first bus section and a second bus section, wherein to each bus section at least one electrical consumer is electrically coupleable; a power switching assembly as disclosed herein, the power switching assembly having its first terminal electrically coupled to the first bus section and having its second terminal electrically coupled to the second bus section.

For example, according to an embodiment, the power distribution system comprises: a first generator for providing electrical energy to the first bus section; a second generator for providing electrical energy to the second bus section; a load controller, the load controller being configured for providing the external control signal to the control input of the power switching assembly in order to control to the magnitude of the current flowing between the first terminal and the second terminal so as alter a load distribution among the first generator and the second generator.

According to a further embodiment the power distribution bus is a DC power distribution bus which receives and distributes DC power.

Other embodiments provide a method of operating a power distribution system having a power distribution bus with a first bus section and a second bus section is provided, the method comprising: Controlling a current flow from the first bus section to the second bus section and from the second bus section to the first bus section.

According to an embodiment, the method comprises sensing a current flowing between the first bus section and the second bus section; and controlling in response hereto a first semiconductor element and a second semiconductor element electrically coupled between the first bus section and the second bus section so as to control the current flowing between the first bus section and the second bus section.

In a further embodiment the method comprises controlling the first semiconductor element and the second semiconductor element in response to the sensed current so as to electrically disconnect the first terminal and the second terminal under predetermined current signal conditions. For example, according to an embodiment, the method comprises controlling the semiconductor elements so as to disconnect the first terminal and the second terminal if the magnitude of the current exceeds a current magnitude threshold. In a further embodiment the method comprises controlling the semiconductor elements so as to disconnect the first terminal and the second terminal if a duration, during which the current remains above a current magnitude, exceeds a current duration threshold. In an embodiment, the current duration threshold depends on the actual current magnitude. For example, in an embodiment the first terminal and the second terminal are disconnected if the current magnitude is within a current magnitude interval for a time that exceeds a first duration threshold.

In other embodiments the power the current between the first bus section and the second bus section is controlled to take an intermediate level between zero and a maximum level.

For example, according to a further embodiment, the method comprises controlling the first semiconductor element and the second semiconductor element so as to control the magnitude of the current flowing between the first terminal and the second terminal in response to the sensed current flowing between the first bus section and the second bus section. For example, in an embodiment, the magnitude of the current is controllably altered depending on the sensed current.

In an embodiment, the current is controlled so as to be limited to a magnitude below a current magnitude threshold.

For example, in an embodiment the magnitude of the current flowing into one of the first bus section and the second bus section is limited depending to the sensed current. For example, if a consumer connected to the respective bus section draws too much current due to a fault, this will not result in a damaging magnitude of the current. In a further embodiment, if the current drawn by the respective bus section is within a predetermined interval for a predetermined time, indicating such a fault, the respective bus section is disconnected.

According to a further embodiment, the power provided to the respective bus section is chopped so as to limit the current flowing to the bus section.

According to a further embodiment, the method further comprises balancing the load of a first generator electrically coupled to the first bus section and the load of the second generator electrically coupled to the second bus section.

Other embodiments provide a computer program for controlling a physical object, e.g., a power switching assembly in a power distribution bus, is provided, the computer program being embodied in non-transitory computer readable media and configured for carrying out the disclosed method when executed by a processor.

According to an embodiment, the computer program also influences the operation of the generator(s) in regard of frequency and voltage. For example, in a further embodiment, the computer program is configured for influencing the operation of the generator in order to achieve the optimal operation and load flow of the complete system including starting and stopping of the generators dependent of the mode of operation. For example, in both embodiments set values are provided to a generator controller.

Other embodiments provide the use of a power switching assembly as a coupler of two bus sections of a power distribution bus, wherein the power switching bus is configured as disclosed herein.

According to an embodiment of the herein disclosed subject matter, the power distribution system is a subsea electrical power distribution system. According to an embodiment of the herein disclosed subject matter, the power distribution system is a subsea direct current (DC) electrical power distribution system.

According to an embodiment, the subsea electrical power distribution system is a subsea electricity network for supplying electrical power to a plurality of electrical consumers. For example, in an embodiment, the subsea electrical power distribution system is a subsea electrical power grid.

According to an embodiment, the subsea electrical power distribution system is configured for connection to a system onboard a ship or onboard an oilrig. Such systems may include a propulsion system and/or a drilling system. Other kinds of sectioned power supply systems should also be covered. For installations except subsea applications liquid or air cooling is the most likely solution.

According to a further embodiment, the voltage of the DC power provided to the power distribution bus is in a range between 500 volts and 5 kilovolts, e.g. between 700 volts and 2 kilovolts, e.g. 1 kilovolt.

According to a further embodiment, one or more of the elements of the power distribution system (referred to hereinafter as system element) is configured for installation at a seabed. For example, in respective embodiments the system element is capable of operating in a water depth below a predefined upper level, e.g. 100 meters (m), 800 meters, 2000 meters or 3000 meters with each upper level corresponding to a respective embodiment of the herein disclosed subject matter. According to respective further embodiments, the system element is capable of operating under a pressure corresponding to the specified depth, wherein in one embodiment the pressure is a pressure generated by sea water of the specified depth and in another embodiment the pressure is a pressure generated by fresh water of the specified depth. According to respective further embodiments, the system element is capable of operating up to predefined lower level of water depth, e.g. 200 meters (m), 1000 meters, 3000 meters or 4000 meters with each lower level corresponding to a respective embodiment of the herein disclosed subject matter, leading to respective pressures which are dependent on the density of the water, e.g. on the temperature and on the type of water (sea water or fresh water).

In the above mentioned embodiments and generally herein, "electrically coupling/decoupling" does not necessarily imply an direct connection of the coupled entities, nor does it necessarily imply an electrical (galvanical) connection. Rather, the electrically coupled entities may be galvanically separated in one embodiment. In such an embodiment the electrical coupling nonetheless provides for transfer of electrical energy between the electrically coupled entities. According to a further embodiment, electrical decoupling prohibits the transfer of electrical energy between the electrically decoupled entities. Further, any intermediate element may be located between the electrically coupled entities.

According to an embodiment, one or more system elements, e.g. any semiconductor element, are installed in an oil-filled container. For example, according to a further embodiment, the power switching assembly is installed in an oil-filled container.

As used herein, reference to a computer program is intended to be equivalent to a reference to a program element and/or a computer readable medium containing instructions for controlling a computer system to coordinate the performance of the above described method.

The computer program may be implemented as computer readable instruction code by use of any suitable programming language, such as, for example, JAVA, C++, and may be stored on a computer-readable medium (removable disk, volatile or non-volatile memory, embedded memory/processor, etc.). The instruction code is operable to program a computer or any other programmable device to carry out the intended functions. The computer program may be available from a network, such as the World Wide Web, from which it may be downloaded.

Embodiments of the herein disclosed subject matter may be realized by means of a computer program respectively software. However, embodiments of the herein disclosed subject matter may also be realized by means of one or more specific electronic circuits respectively hardware. Furthermore, embodiments of the herein disclosed subject matter may also be realized in a hybrid form, i.e. in a combination of software modules and hardware modules.

In the above there have been described and in the following there will be described exemplary embodiments of the subject matter disclosed herein with reference to a power switching assembly, power distribution system and a method of operating a power distribution system. It has to be pointed out that of course any combination of features relating to different aspects of the herein disclosed subject matter is also possible. In particular, some embodiments have been described with reference to apparatus type claims whereas other embodiments have been described with reference to method type claims. However, a person skilled in the art will gather from the above and the following description that, unless other notified, in addition to any combination of features belonging to one aspect also any combination between features relating to different aspects or embodiments, for example even between features of the apparatus type claims and features of the method type claims is considered to be disclosed with this application. For example, a controller of a power switching assembly may have implemented therein one or more of the embodiments disclosed herein.

FIG. 1 shows a power distribution system 100 comprising a DC power distribution bus 102 having a first bus section 104 and a second bus section 106. The DC power distribution bus 102 is operated with direct current (DC) power. The system 100 further comprises a power switching assembly 108 having a first terminal 110 and a second terminal 112. In accordance with an embodiment, the first terminal 110 is electrically coupled to the first bus section 104 and the second terminal 112 is electrically coupled to the second bus section 106.

The power switching assembly 108 comprises a first semiconductor element 114 and a second semiconductor element 116 electrically coupled between the first terminal 110 and the second terminal 112 so as to provide controllability of a current flow from the first terminal 110 to the second terminal 112 and from the second terminal 112 to the first terminal 110. In accordance with an embodiment, the semiconductor elements 114, 116 are insulated gate bipolar transistors coupled to the terminals 110, 112 such that the first semiconductor element 114 conducts current from the first terminal 110 to the second terminal 112 and that the second semiconductor element 116 conducts current from the second terminal 112 to the first terminal 110. In order to bypass the respective other semiconductor element, freewheel diodes 118, 120 as further semiconductor elements are provided. In particular, a first diode 118 is coupled in parallel to the first semiconductor element 114 wherein the conduction direction of the first semiconductor element 114 is reverse to the conduction direction of the associated first diode 118. Likewise, a second diode 120 is coupled in parallel to the second semiconductor element 116 wherein the conduction direction of the second semiconductor element 116 is reverse to the conduction direction of the associated second diode 120, as shown in FIG. 1. In accordance with an embodiment, the first and second semiconductor elements 114, 116 are coupled in series between the first terminal 110 and the second terminal 112.

In accordance with an embodiment, the power switching assembly 108 further comprises a current sensor 122 coupled in series to the first and second semiconductor elements 114, 116 (transistors). The current sensor 122 is configured for sensing a current flowing between the first terminal 110 and the second terminal 112 and providing a current signal 124 in response hereto. Further, the power switching assembly 108 comprises a controller 126 being configured for receiving the current signal 124 and controlling in response hereto the first semiconductor element 114 and the second semiconductor element 116, e.g. by providing a respective first voltage signal 128 to the first semiconductor element 114 and a second voltage signal 130 to the second semiconductor element 116.

The controller 126 may be configured in accordance with any embodiment disclosed herein. For example, in an embodiment the controller 126 is configured for controlling the first semiconductor element 114 and the second semiconductor element 116 so as to connect and disconnect the bus section 104, 106 to each other, depending on the current signal 124. In such an embodiment, the power switching assembly 108 forms a breaker. The breaker according to embodiments of the herein disclosed subject matter has the advantage that it is capable of handling the power level, typically 1000 volts (V), that occurs at the power distribution bus 102.

In accordance with a further embodiment, the controller 126 is configured for controlling the first semiconductor element 114 and the second semiconductor element 116 so as to limit the current flowing through the power switching device 108. To this end, the current sensor 122 is configured and positioned so as to provide a current signal 124 that is indicative of the whole current flowing through the power switching element 108. Various control schemes can be implemented in the controller 126, e.g. control schemes which employ the limiting of the current flowing through the power switching assembly 108.

For example, in case of a failure in one bus section 104, 106 of the bus the sensed current flowing from one bus section (e.g. 104) to the other (e.g. 106) will be monitored and limited by operating the semiconductors. In case the current flows for a time longer than a set limit, the power switching element 108 will open and disconnect the faulty bus section, by virtue of the respective operation of the controller 126. The current limit may be set according to the actual mode of operation in a way that no disturbance of the remaining bus section occurs.

In accordance with an embodiment, the electrical power distribution system 100 further comprises a choke 132 or an inductance coupled in series with the current sensor 122 or, in another embodiment in series with the controllable semiconductor elements 114, 116. The choke 132 serves to reduce current spikes and hence provides for a reliable operation of the current sensor 122.

In accordance with a further embodiment, the power switching assembly 108 comprises a fuse 134 which is coupled in series with the semiconductor elements 114, 116 and serves to protect the semiconductor elements 114, 116, e.g. in case of a malfunction of the control assembly 126.

In accordance with a further embodiment, the electrical power distribution system 100 includes a first disconnector 136 which is electrically connected between the first bus section 104 and the first terminal 110 of the power switching assembly 108 and a second disconnector 138 which is electrically connected between the second bus section 106 and the second terminal 112 of the power switching assembly 108. The disconnectors 136, 138 are closed in normal operation, thereby providing an electrical connection between the respective bus sections and terminals. For maintenance purposes, the disconnectors 136, 138 can be opened thereby disconnecting the power switching system 108 from the power distribution bus 102.

It should be noted that generally herein the elements that are associated with a certain entity in exemplary (depicted) embodiments may also be associated with another entity in other embodiments. For example, in an embodiment, the disconnectors 136, 138 are associated with the power switching assembly 108 (not shown in FIG. 1).

Figure 2:
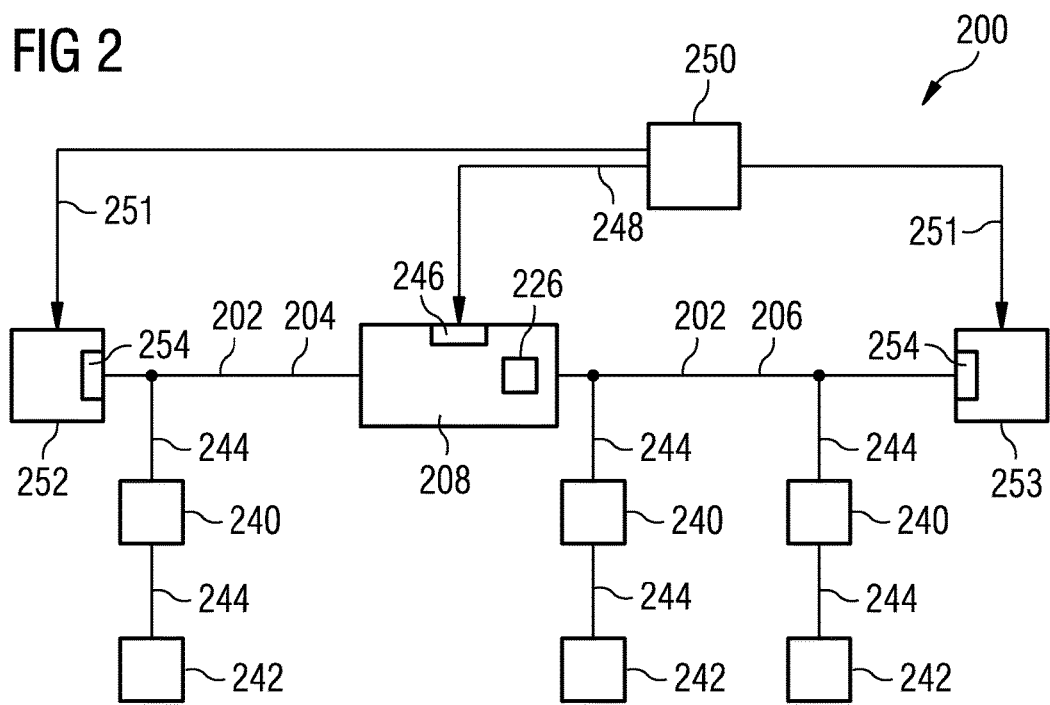
FIG. 2 shows in part a further electrical power distribution system in accordance with embodiments of the herein disclosed subject matter.

FIG. 2 shows in part a further electrical power distribution system 200 in accordance with embodiments of the herein disclosed subject matter.

The structure of power switching assembly 208 in FIG. 2 is similar to the structure of the power switching assembly 108 which is shown in detail in FIG. 1 and the description thereof is not repeated here. However, the controller 226 of the power switching assembly 208 in FIG. 2 is configured different as compared with the controller 126 of FIG. 1.

In accordance with an embodiment of the power switching assembly 208, the controller implements a precharging device: In a DC distribution system 200 where a number of inverters 240 are connected to the power distribution bus 202, all the DC capacitors (not shown in FIG. 2) in the inverters are connected to the DC bus 202. Further shown in FIG. 2 are electrical consumers, indicated at 242. Electrical coupling of the individual elements may be performed in any suitable way, e.g. by electrical wires or cables. This is exemplarily indicated at 244 in FIG. 2. When energizing the bus 202 the current must be limited. The power switching assembly 208 may in this situation be operate as a chopper, by virtue of the respectively configured controller 226, limiting the current to a selected level, ensuring an effective limitation of the inrush current.

In accordance with an embodiment of the controller according to the herein disclosed subject matter, also implemented in the controller 226 of the power switching assembly 208 in FIG. 1, the power switching assembly 208 is configured for implementing a load balancer. To this end and in accordance with a further embodiment, the power switching assembly 208 further comprises at least one control input 246 for receiving an external control signal 248. In an embodiment, the external control signal 248 is received from a voltage control system 250 which also provides control signals 251 to generators 252, 253 feeding the bus sections 204, 206 via rectifiers 254. The controller 226 is configured for controlling, in response to the external control signal 248, the first semiconductor element and the second semiconductor element (not shown in FIG. 2) of the power switching assembly 208.

In response the received external control signals 248 from the voltage control system 250, the power switching assembly operates as a load balancer by limiting the current flowing e.g. from a first generator electrically coupled to the first bus section 204 through the first bus section 202 and through the power switching assembly 208 into the second bus section 206, thereby ensuring an optimized operation of the generators and still remaining the reliability of two independent bus sections 204, 206 in case of failure.

Figure 3:
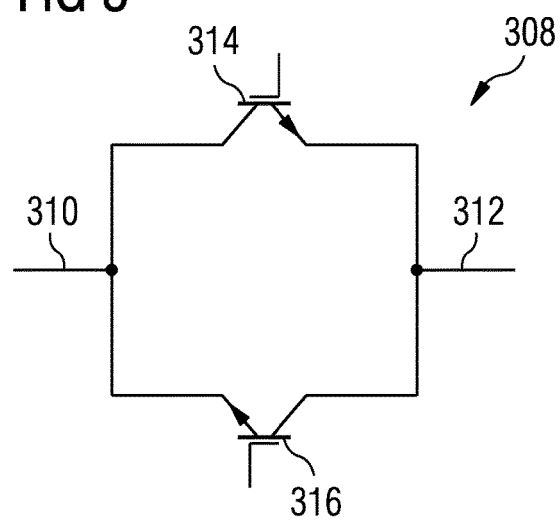
FIG. 3 shows a power switching assembly in accordance with embodiments of the herein disclosed subject matter.

FIG. 3 shows in part a power switching assembly 308 in accordance with embodiments of the herein disclosed subject matter.

In accordance with embodiments of the herein disclosed subject matter, the power switching assembly 308 comprises a first terminal 310, a second terminal 312 and a first semiconductor element 314 and a second semiconductor element 316. The first semiconductor element 314 and the second semiconductor element 316 are electrically coupled in parallel between the first terminal 310 and the second terminal 312 so as to provide controllability of a current flow from the first terminal 310 to the second terminal 312 and from the second terminal 312 to the first terminal 310.

In accordance with an embodiment shown in FIG. 3, the first and second semiconductor elements are IGBT's. In other embodiments, the semiconductor elements may be e.g. tyristors.

It should be noted that the above described embodiments may be varied while still remaining in accordance with the appended claims. For example, in respective embodiments, the choke 132 and/or the fuse 134 and/or the disconnectors 136, 138 may be omitted. According to an embodiment, the DC power is a dipole power. According to another embodiment, the DC power is not a dipole DC power but rather a multipole DC power having more than two poles.

Further, the specified number and arrangement of rectifiers, inverters, electrical consumers and controllers does not exclude other numbers and arrangements of such entities. For example, the controller of the power switching assembly may be located in close proximity to the semiconductor elements or may be located remote from the semiconductor element. Further it should further be noted that a subsea electrical power distribution system or a land-based electrical power distribution system in accordance with embodiments of the herein disclosed subject matter is not limited as to include the dedicated entities described in some embodiments above. Further, the herein disclosed subject matter may be implemented in various ways in various locations in a subsea electrical power distribution system or in a land-base electrical power distribution system while still providing the desired functionality.

It should be noted that the term "comprising" does not exclude other elements or steps and the "a" or "an" does not exclude a plurality. Also elements described in association with different embodiments may be combined. It should also be noted that reference signs in the claims should not be construed as limiting the scope of the claims.

In order to summarize aspects of the above described embodiments, a power switching assembly for switching power in a power distribution bus, and a power distribution system comprising such a power switching assembly are disclosed, the power switching assembly comprising a first terminal, a second terminal, a first semiconductor element and a second semiconductor element electrically coupled between the first terminal and the second terminal so as to provide controllability of a current flow from the first terminal to the second terminal and from the second terminal to the first terminal. A controller for controlling the semiconductor elements may be configured to implement one or more of various control schemes such as a breaker, a current limiter, a load balancer and a precharging device. All power electronic modules may be installed in oil filled canisters and exposed to the ambient pressure at the seabed.

What is claimed is:

1. Power switching assembly for switching power in a power distribution bus, the power switching assembly comprising:

a first terminal;
a second terminal;
a first semiconductor element and a second semiconductor element electrically coupled between the first terminal and the second terminal, wherein the first semiconductor element coupled between the first terminal and the second terminal is controllable to selectively allow a current flow in a first direction from the first terminal to the second terminal, and wherein the second semiconductor element coupled between the first terminal and the second terminal is controllable to selectively allow a current flow in a second direction, opposite the first direction, from the second terminal to the first terminal;
a current sensor for sensing a current flowing between the first terminal and the second terminal and providing a current signal in response hereto;
a controller being configured for receiving the current signal and controlling in response hereto the first semiconductor element and the second semiconductor element;
wherein the first terminal of the power switching assembly is electrically coupled to a first bus section of the power distribution bus and the second terminal of the power switching assembly is electrically coupled to a second bus section of the power distribution bus;
wherein a first generator is electrically coupled to the first bus section independent of the first and second semiconductor elements for providing electrical energy to the first bus section and selectively electrically coupled to the second bus section as a function of the control of the first semiconductor element by the controller;
wherein a second generator is electrically coupled to the second bus section independent of the first and second semiconductor elements for providing electrical energy to the second bus section while the first generator is providing electrical energy to the first bus section, and selectively electrically coupled to the first bus section as a function of the control of the second semiconductor element by the controller;
wherein each bus section is adapted to electrically couple to at least one electrical consumer; and
wherein the controller is configured to perform a load balancing between the first and second generators, with respect to a total load including at least one electrical consumer coupled to the first bus section and at least one electrical consumer coupled to the second bus section, at least by controlling the first semiconductor element and the second semiconductor element to connect and disconnect the first bus section to or from the second bus section.

2. Power switching assembly of claim 1,
wherein the controller is configured for controlling the first semiconductor element and the second semiconductor element in response to the current signal so as to control the magnitude of the current flowing between the first terminal and the second terminal in response to the current signal.

3. Power switching assembly of claim 1, comprising a control input for receiving an external control signal; and
wherein the controller is configured for controlling, in response to the external control signal, the first semiconductor element and the second semiconductor element.

4. Power switching assembly of claim 1, wherein the first and second semiconductor elements are electrically coupled in series between the first terminal and the second terminal.

5. Power switching assembly of claim 1, wherein the first and second semiconductor elements are electrically coupled in parallel between the first terminal and the second terminal.

6. Power distribution system comprising:
a power distribution bus having a first bus section coupled to a first generator and a second bus section coupled to a second generator, wherein each bus section is adapted to be electrically coupled to at least one electrical consumer;
a power switching assembly for switching power in a power distribution bus, the power switching assembly comprising:
a first terminal electrically coupled to the first bus section;
a second terminal electrically coupled to the second bus section; and
a first semiconductor element and a second semiconductor element electrically coupled between the first terminal and the second terminal, wherein the first semiconductor element coupled between the first terminal and the second terminal is controllable to selectively allow a current flow in a first direction from the first terminal to the second terminal, and wherein the second semiconductor element coupled between the first terminal and the second terminal is controllable to selectively allow a current flow in a second direction, opposite the first direction, from the second terminal to the first terminal;
wherein the power switching assembly is configured to perform a load balancing of current supply by the first and second generators, with respect to a total load including at least one electrical consumer coupled to the first bus section and at least one electrical consumer coupled to the second bus section, at least by controlling the first and second semiconductor elements to connect and disconnect the first bus section to or from the second bus section.

7. Power distribution system of claim 6, comprising:
a first generator for providing electrical energy to the first bus section;
a second generator for providing electrical energy to the second bus section;
a load controller configured for providing an external control signal to the control input of the power switching assembly to control to the magnitude of the current flowing between the first terminal and the second terminal to alter a load distribution among the first generator and the second generator.

8. Power distribution system of claim 6, wherein the power distribution bus is a DC power distribution bus.

9. Power distribution system of claim 6, wherein the power switching assembly further comprises:
a current sensor for sensing a current flowing between the first terminal and the second terminal and providing a current signal in response thereto; and
a controller being configured for receiving the current signal and controlling in response hereto the first semiconductor element and the second semiconductor element.

10. Power distribution system of claim 9, wherein the controller is configured for controlling the first semiconductor element and the second semiconductor element in response to the current signal so as to control the magnitude of the current flowing between the first terminal and the second terminal in response to the current signal.

11. Power distribution system of claim 9, wherein the power switching assembly further comprises a control input for receiving an external control signal; and wherein the controller is configured for controlling, in response to the external control signal, the first semiconductor element and the second semiconductor element.

12. Power distribution system of claim 6, wherein the first and second semiconductor elements are electrically coupled in series between the first terminal and the second terminal.

13. Power distribution system of claim 6, wherein the first and second semiconductor elements are electrically coupled in parallel between the first terminal and the second terminal.

14. A method of operating a power distribution system having a power distribution bus with a first bus section and a second bus section, wherein a first generator is electrically coupled to the first bus section for providing electrical energy to the first bus section and a second generator is electrically coupled to the second bus section for providing electrical energy to the second bus section while the first generator is providing electrical energy to the first bus section, and wherein each bus section is adapted to be electrically coupled to at least one electrical consumer, the method comprising:

sensing a current flowing between the first bus section and the second bus section;

selectively controlling, in response to the sensed current:
    a first semiconductor element electrically coupled between the first bus section and the second bus section to selectively allow a current flow in a first direction from the first bus section to the second bus section; and
    a second semiconductor element electrically coupled between the first bus section and the second bus section, and coupled with the first semiconductor element, to selectively control a current flow in a second direction, opposite the first direction, from the second bus section to the first bus section; and performing a load balancing between the first and second generators, with respect to a total load including the at least one electrical consumer coupled to the first bus section and the at least one electrical consumer coupled to the second bus section, at least by controlling the first semiconductor element and the second semiconductor element in response to the sensed current so as to electrically disconnect the first bus section and the second bus section under predetermined current signal conditions.

* * * * *